United States Patent
Yang et al.

(10) Patent No.: US 9,911,770 B2
(45) Date of Patent: Mar. 6, 2018

(54) GRADED-SEMICONDUCTOR IMAGE SENSOR

(71) Applicant: OMNIVISION TECHNOLOGIES, INC., Santa Clara, CA (US)

(72) Inventors: Dajiang Yang, San Jose, CA (US); Gang Chen, San Jose, CA (US); Duli Mao, Sunnyvale, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/169,477

(22) Filed: May 31, 2016

(65) Prior Publication Data

US 2017/0345851 A1 Nov. 30, 2017

(51) Int. Cl.
*H04N 5/347* (2011.01)
*H01L 27/146* (2006.01)
*H01L 31/0392* (2006.01)
*H01L 31/18* (2006.01)

(52) U.S. Cl.
CPC ...... *H01L 27/1461* (2013.01); *H01L 27/1463* (2013.01); *H01L 27/1464* (2013.01); *H01L 27/14645* (2013.01); *H01L 27/14649* (2013.01); *H01L 27/14689* (2013.01); *H01L 31/03921* (2013.01); *H01L 31/1812* (2013.01)

(58) Field of Classification Search
None
See application file for complete search history.

(56) References Cited

U.S. PATENT DOCUMENTS

| 7,361,528 B2 | 4/2008 | Lee et al. | |
| 2013/0048831 A1* | 2/2013 | Bikumandla | H04N 5/3559 250/208.1 |
| 2013/0161485 A1* | 6/2013 | Oh | H01L 27/14612 250/208.1 |
| 2014/0054444 A1* | 2/2014 | Sasaki | H01L 31/0312 250/208.1 |

(Continued)

OTHER PUBLICATIONS

Liu, J. L. et al., "A surfactant-mediated relaxed $Si_{0.5}Ge_{0.5}$ graded layer with a very low threading dislocation density and smooth surface", Applied Physics Letters, vol. 75, No. 11, Sep. 13, 1999, pp. 1586-1588, © 1999 American Institute of Physics.

(Continued)

*Primary Examiner* — Ali Naraghi
(74) *Attorney, Agent, or Firm* — Christensen O'Connor Johnson Kindness PLLC

(57) ABSTRACT

An image sensor includes a semiconductor material having an illuminated surface and a non-illuminated surface. A plurality of photodiodes is disposed in the semiconductor material to receive image light through the illuminated surface. The semiconductor material includes silicon and germanium, and the germanium concentration increases in a direction of the non-illuminated surface. A plurality of isolation regions is disposed between individual photodiodes in the plurality of photodiodes. The plurality of isolation regions surround, at least in part, the individual photodiodes and electrically isolate the individual photodiodes.

15 Claims, 4 Drawing Sheets

(56) References Cited

U.S. PATENT DOCUMENTS

2015/0200223 A1* 7/2015 Lee .................. H01L 27/14689
257/292
2016/0057368 A1* 2/2016 Shin .................... H04N 5/3745
250/208.1

OTHER PUBLICATIONS

Liu, J. L. et al., "High-quality Ge films on Si substrates using Sb surfactant-mediated graded SiGe buffers", Applied Physics Letters, vol. 79, No. 21, Nov. 19, 2001, pp. 3431-3433, © 2001 American Institute of Physics.

Huang, W. et al., "Growth of Graded SiGe Films by Novel UHV/CVD System", The Fourth International Workshop on Junction Technology, Mar. 15-16, 2004, Institute of Microelectronics, Tsinghua University, Beijing, China, pp. 281-284, © 2004 IEEE.

Sood, A. K. et al., "Development of Low Dark Current SiGe-Detector Arrays for Visible-NIR Imaging Sensor", Infrared Technology and Applications XXXV, Proc. of SPIE, vol. 7298 72983D, 11 pages, Orlando, Florida, © 2009 SPIE.

Kaufmann, R. et al., "Near infrared image sensor with integrated germanium photodiodes", Journal of Applied Physics, vol. 110, 023107, 2011, 6 pages, © 2011 American Institute of Physics.

\* cited by examiner

GRADED-SEMICONDUCTOR IMAGE SENSOR

TECHNICAL FIELD

This disclosure relates generally to semiconductor fabrication, and in particular but not exclusively, relates to composition of semiconductor image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Detection of infrared (IR) light is useful in automotive and night vision applications. However, conventional image sensor devices may poorly absorb infrared light due to the band structure of semiconductor materials used in modern microelectronic devices. Even if conventional image sensors can absorb IR light, the semiconductor may need to be sufficiently thick. Additional semiconductor thickness may complicate other fabrication steps and/or reduce performance.

Furthermore, many materials conducive to absorbing IR light are very expensive (either inherently or by virtue of fabrication techniques needed to process the materials), toxic, and/or have lower sensitivity to the visible spectrum. Accordingly, many elements/compounds capable of detecting IR light may not be ideal choices for integration into modern electronic devices.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
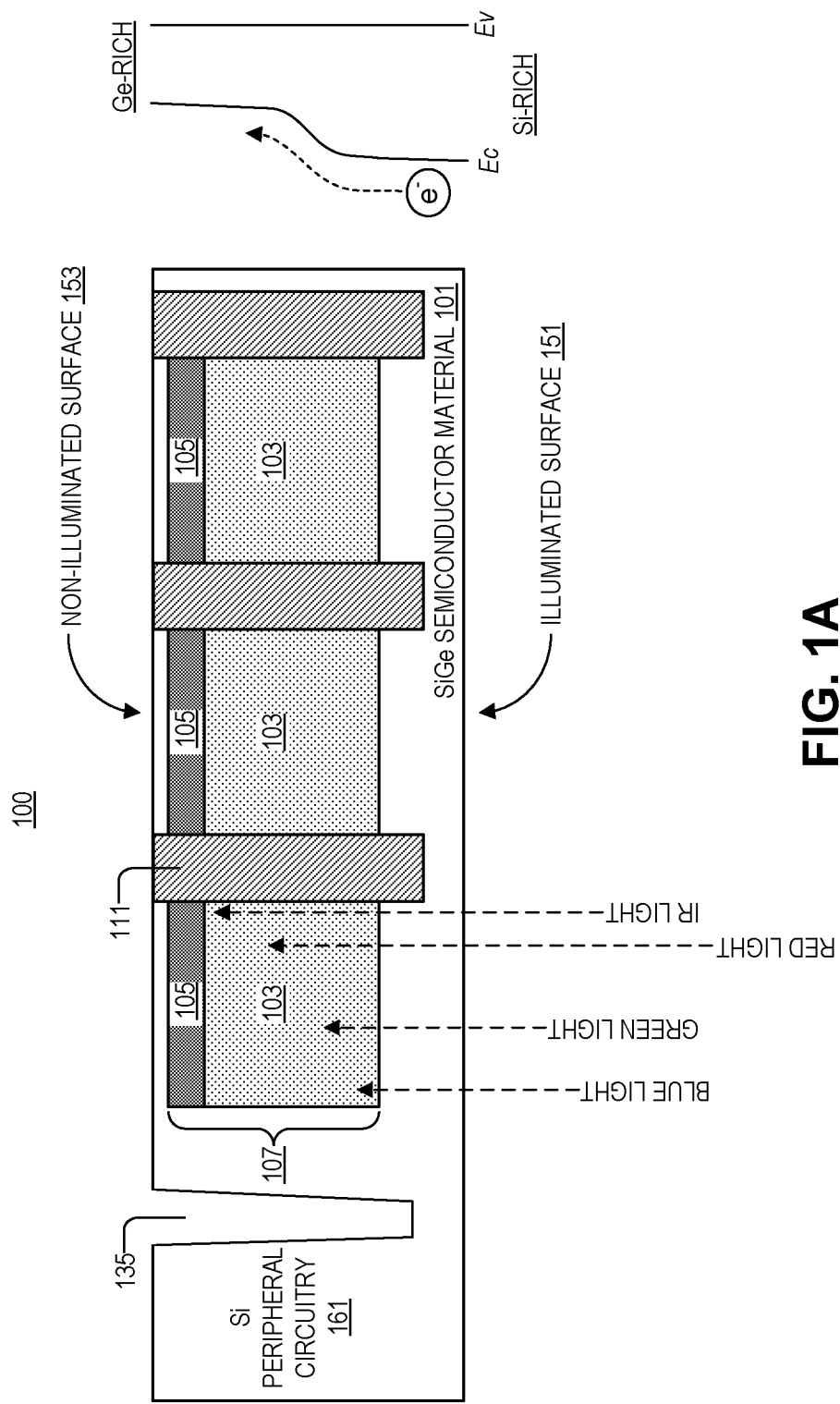
FIG. 1A is a cross sectional illustration of an example image sensor, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for a graded-semiconductor image sensor are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1A is a cross sectional illustration of an example image sensor 100. Image sensor 100 includes: semiconductor material 101, plurality of photodiodes 107, plurality of isolation regions 111, and peripheral circuitry 161. Individual photodiodes 107 in plurality of photodiodes 107 include doped region 103 and heavily doped region 105.

Semiconductor material 101 has an illuminated surface 151 and a non-illuminated surface 153. In one example, illuminated surface 151 is a backside of semiconductor material 101, and non-illuminated surface 153 is a frontside of semiconductor material 101. Plurality of photodiodes 107 is disposed in semiconductor material 101 to receive image light through illuminated surface 151, and plurality of photodiodes 107 (along with plurality of isolation regions 111) extend through a majority of the semiconductor material 101. Semiconductor material 101 includes an epitaxially grown silicon and germanium compound, and the germanium concentration increases in a direction of the non-illuminated surface 153. The increasing germanium concentration in the direction of the non-illuminated surface 153 results in a potential energy gradient from the illuminated surface 151 to the non-illuminated surface 153. Potential energy is lower in the direction of the non-illuminated surface 153. An example potential energy gradient is illustrated by the band diagram on the right-hand side of FIG. 1A. Because SiGe has a narrower bandgap than Si, the potential energy of image sensor 100 decreases in the direction of non-illuminated surface 153 (i.e., the distance between valence band (Ev) and conduction band (Ec) gets smaller approaching the non-illuminated surface 153. In one example, the germanium concentration at the non-illuminated surface 153 of semiconductor material 101 is greater than 35%. In other examples, the germanium concentration may reach 50% or more. This promotes the flow of free electrons (generated near the illuminated surface 151) to the non-illuminated surface 153, and helps reduce electrical crosstalk between individual photodiodes 107.

To further improve charge transfer from the illuminated surface 151 to the non-illuminated surface 153, plurality of photodiodes 107 includes doped region 103 and heavily doped region 105. As depicted, doped region 103 is disposed in semiconductor material 101 between illuminated surface 151 and heavily doped region 105. Heavily doped region 105 is of an opposite majority charge carrier type (opposite doping profile) as doped region 103. In one example, doped region 103 is n-type and heavily doped region 105 is p-type, while in a different example, doped region 103 is p-type and heavily doped region 105 is n-type.

Furthermore, increased Ge content improves infrared (IR) light sensitivity. While silicon is capable of absorbing IR light, the extinction coefficient of IR light in silicon is lower than the extinction coefficient of visible wavelengths of light. Since SiGe has a narrower bandgap than native silicon, IR light is readily absorbed in relatively thin SiGe layers (e.g., less than 2.5 μm thick). In the depicted example, blue light is absorbed at a first depth in semiconductor material 101, green light is absorbed at a second depth in semiconductor material 101, red light is absorbed at a third depth in semiconductor material 101, and infrared light is absorbed at a fourth depth (where the Ge concentration is high) in semiconductor material 101. The fourth depth is greater than the third depth, the third depth is greater than the second depth, and the second depth is greater than the first depth. Furthermore, depth is measured from illuminated surface 151.

As shown, plurality of isolation regions 111 is disposed between individual photodiodes 107 in the plurality of photodiodes 107. Plurality of isolation regions 111 surround, at least in part, individual photodiodes 107 and electrically isolate individual photodiodes 107. Although FIG. 1A depicts a partial cross sectional view of image sensor 100, isolation regions 111 encircle individual photodiodes 107 and include doped portions of semiconductor material 101. In other examples, isolation regions 111 may be etched into semiconductor material 101 and include metals, and/or oxides.

In the depicted example, peripheral circuitry 161, including control circuitry and readout circuitry, is laterally proximate to plurality of photodiodes 107 and is electrically coupled to plurality of photodiodes 107. Although in the depicted example, peripheral circuitry 161 is disposed on the left-hand side of the plurality of photodiodes 107, in other examples, peripheral circuitry 161 may be disposed on any side(s) of plurality of photodiodes 107, or may entirely surround plurality of photodiodes 107. Additionally, as shown peripheral circuitry 161 may be separated from plurality of photodiodes by deep trench isolation 135 to prevent electrical crosstalk. Deep trench isolation 135 may be filled with semiconductor, oxide, or metal materials.

Figure 1B:
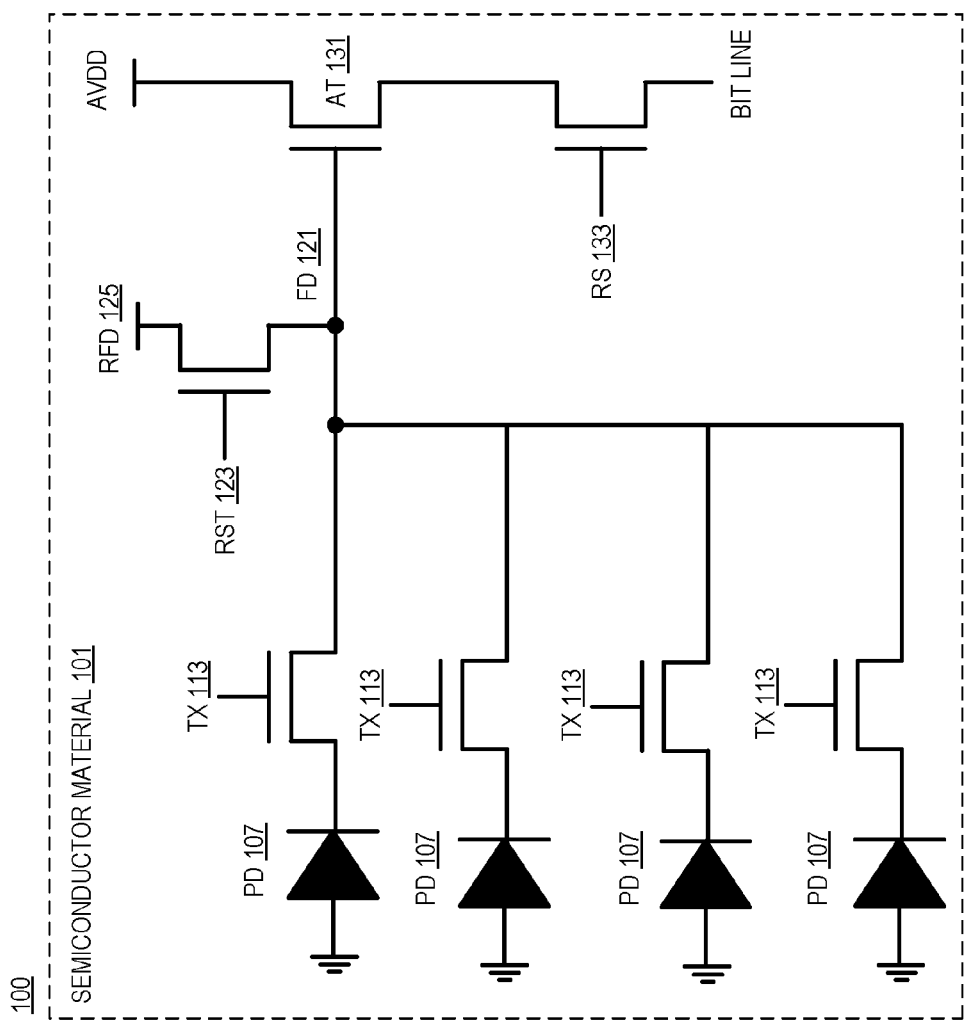
FIG. 1B is a circuit diagram of the image sensor in FIG. 1A, in accordance with the teachings of the present invention.

FIG. 1B is a circuit diagram of image sensor 100 in FIG. 1A. In the depicted example, image sensor 100 includes: semiconductor material 101, plurality of photodiodes 107, plurality of transfer gates 113, floating diffusion 121, reset transistor 123, amplifier transistor 131, and row select transistor 133. Plurality of photodiodes 107 is disposed in semiconductor material 101 to accumulate image charge in response to incident light directed into plurality of photodiodes 107. In one example, semiconductor material 101 may include silicon and germanium, but may include other suitable semiconductor materials and dopant atoms. Plurality of transfer gates 113 is also disposed in semiconductor material 101 and individual transfer gates 113 in plurality of transfer gates 113 are coupled to individual photodiodes 107 in plurality of photodiodes 107. Floating diffusion 121 is disposed in semiconductor material 101, and floating diffusion 121 is coupled to the plurality of transfer gates 113 to receive image charge from plurality of photodiodes 107 in response to a transfer signal sequentially applied to a control terminal of each individual transfer gate 113. In other words, in the depicted example, a transfer signal is applied to the control terminal of the top transfer gate 113, then a transfer signal is applied to the control terminal of the second-from-the-top transfer gate 113, etc. Reset transistor 123 is coupled to floating diffusion 121 to extract the image charge from floating diffusion 121. Further, amplifier transistor 131 is coupled to floating diffusion 121, and row select transistor 133 is coupled between an output of amplifier transistor 131 and a bit line output. In one example, amplifier transistor 131 includes a source follower coupled transistor.

Although not depicted in FIG. 1A, elements of readout circuitry may be disposed proximate to the non-illuminated surface 153 of semiconductor material 101. For example, transfer gates 113 and floating diffusion 121 may be disposed near the non-illuminated surface 153 to readout image charge from the plurality of photodiodes 107. Accordingly, the increasing germanium concentration in the direction of the non-illuminated surface 153 is useful to consolidate charge near the active circuit elements. Charge consolidation may make electron/hole extraction from plurality of photodiodes 107 more efficient.

In the depicted example, plurality of photodiodes 107 includes four photodiodes 107 coupled to floating diffusion 121 through transfer gates 113. However, in a different example, any number of photodiodes 107 may be coupled to floating diffusion 121 including two, six, and eight photodiodes 107. In the depicted example, the four photodiodes 107 include one photodiode 107 disposed to absorb green light, one photodiode 107 disposed to absorb blue light, one photodiode 107 disposed to absorb red light, and one photodiode 107 disposed to absorb infrared light. Although not depicted in FIG. 1B, color selection may be accomplished by placing a color filter layer proximate to semiconductor material 101. In one example, the color filter layer includes red, infrared, green, and blue color filters which may be arranged into a Bayer pattern, EXR pattern, X-trans pattern, or the like. However, in a different or the same example, the color filter layer may include infrared filters, ultraviolet filters, or other light filters that isolate invisible portions of the EM spectrum. In the same or a different example, a microlens layer is formed on the color filter layer. The microlens layer may be fabricated from a photo-active polymer that is patterned on the surface of the color filter layer. Once rectangular blocks of polymer are patterned on the surface of the color filter layer, the blocks may be melted (or reflowed) to form the dome-like structure characteristic of microlenses.

Figure 2:
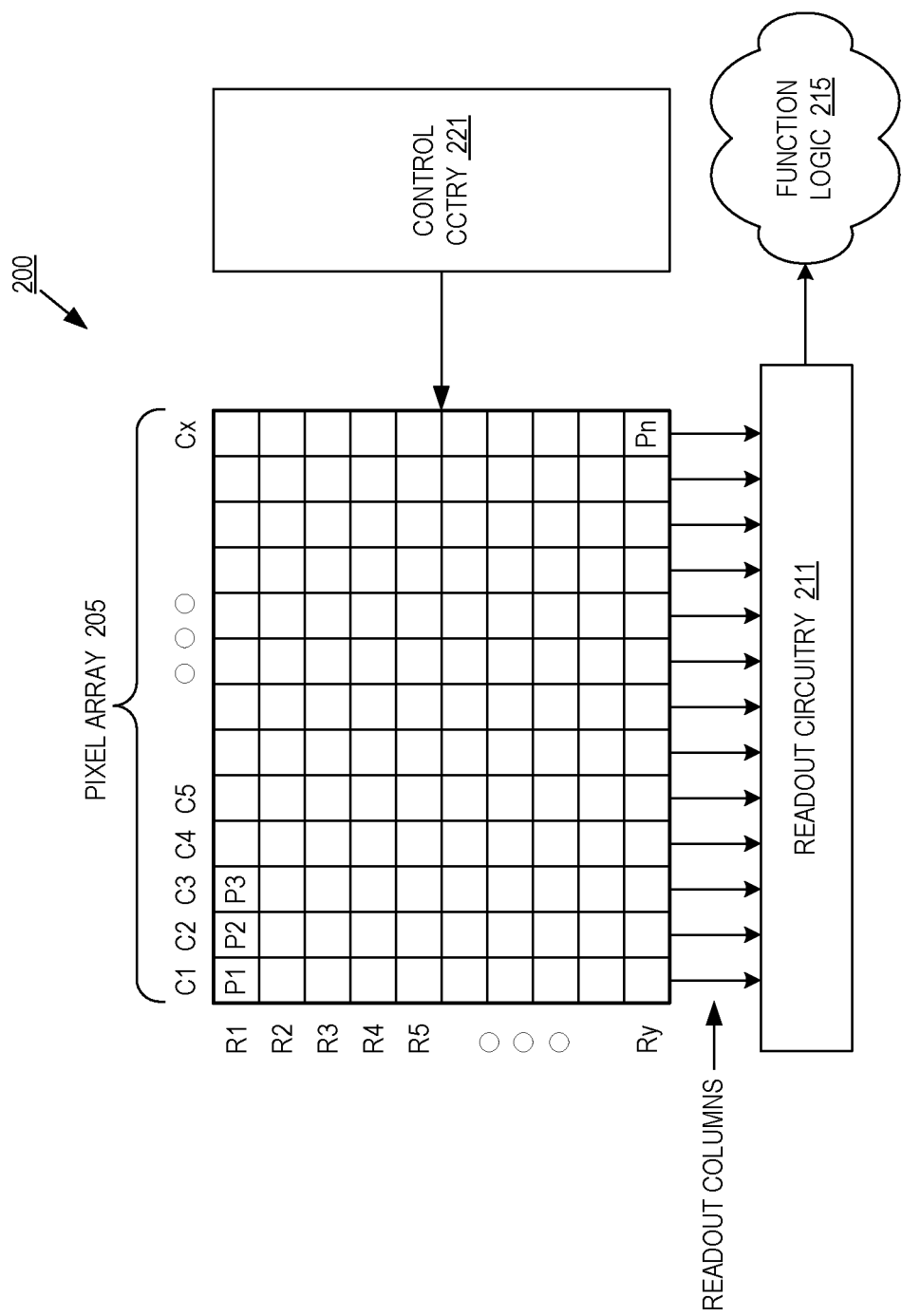
FIG. 2 is a block diagram illustrating one example of an imaging system including the image sensor of FIG. 1A, in accordance with the teachings of the present invention.

FIG. 2 is a block diagram illustrating one example of imaging system 200 including the image sensor of FIG. 1A. Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 205 has acquired its image data or image charge, the image data is readout by readout circuitry 211 and then transferred to function logic 215. In various examples, readout circuitry 211 may include amplification circuitry, analog-to-digital (ADC) conversion circuitry, or otherwise. Function logic 215 may simply store the image data or even manipulate the image data by applying post image effects (e.g., crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. For example, control circuitry 221 may generate a shutter signal for controlling image acquisition. In one example, the shutter signal is a global shutter signal for simultaneously enabling all pixels within pixel array 205 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 200 may be included in a digital camera, cell phone, laptop computer, automobile or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

Figure 3:
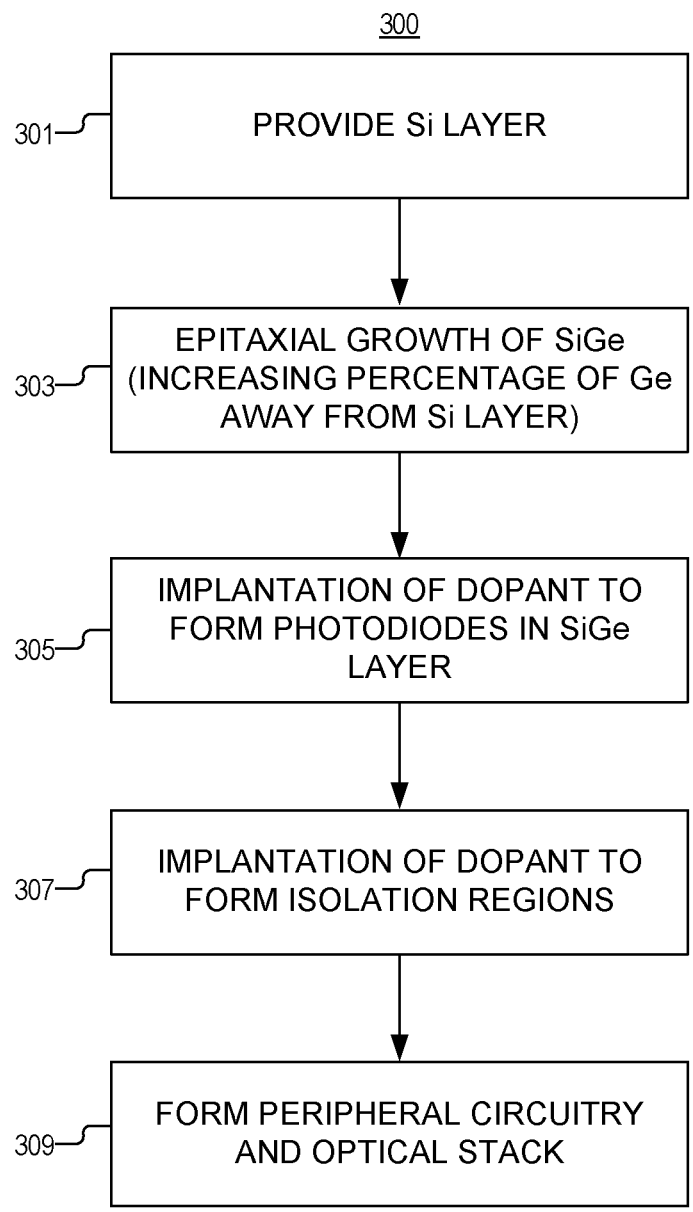
FIG. 3 illustrates an example method for forming the image sensor of FIG. 1A, in accordance with the teachings of the present invention.

FIG. 3 illustrates an example method 300 for forming the image sensor of FIG. 1A. The order in which some or all process blocks appear in method 300 should not be deemed limiting. Rather, one of ordinary skill in the art having the benefit of the present disclosure will understand that some of method 300 may be executed in a variety of orders not illustrated, or even in parallel. Furthermore, method 300 may omit certain process blocks in order to avoid obscuring certain aspects. Alternatively, method 300 may include additional process blocks that may not be necessary in some embodiments/examples of the disclosure.

Process block 301 illustrates providing a silicon layer. In one example, the silicon layer may be a silicon wafer for use as a substrate to epitaxially grow the semiconductor material via chemical vapor deposition, atomic layer deposition, molecular beam epitaxy or the like. In one example, the silicon layer may be a silicon buffer layer.

Process block 303 shows epitaxially growing the SiGe semiconductor material on the silicon layer. In one example, this involves depositing a layer of antimony on the silicon buffer layer and growing the semiconductor material (SiGe) such that the layer of antimony is disposed between the silicon buffer layer and the semiconductor material. The germanium concentration increases in the direction of the non-illuminated surface of the semiconductor material. In one example, the germanium concentration at the non-illuminated surface of the semiconductor material is greater than 35%, and the semiconductor material is less than 2.5 µm thick.

Although using SiGe as the semiconductor material is discussed in depth throughout this application, other narrow bandgap semiconductor materials may be employed including: GaAs, Pbs, PbSe, PbTe, GaSb, InN, etc. Furthermore, any group 3 elements (B, Al, Ga, In, Tl), group 4 elements (C, Si, Ge, Sn, Pb), group 5 elements (N, P, As, Sb, Bi), or the like, may be used to form a suitable IR-absorbing semiconductor material, in accordance with the teachings of the present invention.

Process block 305 depicts forming a plurality of photodiodes (including a doped region and a heavily doped region) in the semiconductor material via ion implantation. However in other examples, the plurality of photodiodes is formed by dopant inclusion during semiconductor material growth (e.g., incorporating arsenic-based gasses in a chemical vapor deposition semiconductor growth process). In the depicted example, the doped region is of an opposite majority charge carrier type as the heavily doped region, and the doped region is disposed between the illuminated surface and the heavily doped region.

Process block 307 shows forming (via ion implantation) a plurality of isolation regions disposed between individual photodiodes in the plurality of photodiodes. The plurality of isolation regions surround, at least in part, the individual photodiodes and electrically isolate the individual photodiodes. Isolation regions may include a number of semiconductor elements and dopants. In some examples, isolation regions may also include oxides/nitrides such as silicon oxide ($SiO_2$), hafnium oxide ($HfO_2$), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like. Additionally, one skilled in the relevant art, will recognize that any stoichiometric combination of the above metals/semiconductors and their oxides/nitrides/oxynitrides may be used, in accordance with the teachings of the present invention.

Block 309 depicts forming peripheral circuitry, including control circuitry and readout circuitry, laterally proximate to the plurality of photodiodes and electrically coupled to the plurality of photodiodes (as illustrated in FIG. 1A). Furthermore, process block 309 illustrates forming an optical stack. The optical stack may include color filters, microlenses and other secondary optical structures to optimize image acquisition by the image sensor.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
a semiconductor material having an illuminated surface and a non-illuminated surface, and a plurality of photodiodes arranged into an array an disposed to receive image light through the illuminated surface, wherein a portion of the semiconductor material, including the plurality of photodiodes arranged into the array, includes silicon and germanium, and a germanium concentration increases in a direction of the non-illuminated surface to increase red and infrared sensitivity of the plurality of photodiodes, wherein increasing the germanium concentration in the direction of the non-illuminated surface results a potential energy gradient from the illuminated surface to the non-illuminated surface, and wherein potential energy is lower in the direction of the non-illuminated surface; a layer of antimony disposed in the semiconductor material; a plurality of isolation regions disposed between individual photodiodes in the plurality of photodiodes, wherein the plurality of isolation regions surround, at least in part, the individual photodiodes and electrically isolate the individual photodiodes; and peripheral circuitry disposed in a peripheral region laterally proximate to the plurality of photodiodes and separated from the array by a deep trench isolation structure, wherein the peripheral circuitry includes, at least in part, control circuitry to control operation of the plurality of photodiodes and readout circuitry to readout image charge from the plurality of photodiodes, wherein the peripheral region is substantially silicon devoid of germanium and antimony.

2. The image sensor of claim 1, wherein blue light is absorbed at a first depth in the semiconductor material, green light is absorbed at a second depth in the semiconductor material, red light is absorbed at a third depth in the semiconductor material, and infrared light is absorbed at a fourth depth in the semiconductor material, wherein the fourth depth is greater than the third depth, the third depth is greater than the second depth, and the second depth is greater than the first depth, and wherein depth is measured from the illuminated surface.

3. The image sensor of claim 1, wherein the germanium concentration at the non-illuminated surface of the semiconductor material is greater than 35%.

4. The image sensor of claim 1, wherein the plurality of isolation regions encircle the individual photodiodes and include doped portions of the semiconductor material.

5. The image sensor of claim 1, wherein each one of the plurality of photodiodes includes a doped region and a heavily doped region, wherein the heavily doped region is of an opposite majority charge carrier type as the doped region, and wherein the doped region is disposed in the semiconductor material between the illuminated surface and the heavily doped region.

6. The image sensor of claim 1, wherein the plurality of photodiodes and the plurality of isolation regions extend through a majority of the semiconductor material.

7. The image sensor of claim 1, wherein the semiconductor material is less than 2.5 µm thick.

8. The image sensor of claim 1, wherein at least a portion of the semiconductor material containing silicon and germanium is epitaxially grown.

9. The image sensor of claim 1, further comprising:
a plurality of transfer gates disposed proximate to the non-illuminated surface of the semiconductor material and coupled to the plurality of photodiodes, wherein individual transfer gates in the plurality of transfer gates are coupled to individual photodiodes in the plurality of photodiodes;
a floating diffusion coupled to receive the image charge from the plurality of photodiodes in response to a transfer signal sequentially applied to a control terminal of the individual transfer gates;
a reset transistor coupled to reset the image charge on the floating diffusion;
a source follower transistor coupled to the floating diffusion to amplify the image charge on the floating diffusion; and
a row select transistor coupled to an output terminal of the source follower transistor and a bit line output.

10. The image sensor of claim 9, wherein four photodiodes in the plurality of photodiodes are coupled to the floating diffusion.

11. The image sensor of claim 9, wherein the plurality of transfer gates are positioned to extract the image charge from a location of consolidated charge in the plurality of photodiodes proximate to the non-illuminated surface, resulting from the germanium concentration increasing in a direction of the non-illuminated surface.

12. The image sensor of claim 1, wherein the deep trench isolation structure separating the plurality of photodiodes arranged into an array from the peripheral circuit region includes at least one of an oxide or a metal.

13. The image sensor of claim 12, wherein the deep trench isolation structure entirely surrounds the plurality of photodiodes arranged into an array to prevent optical crosstalk between the substantially silicon based peripheral circuitry and the plurality of photodiodes.

14. The image sensor of claim 1, further comprising a color filter layer disposed proximate to the semiconductor material and positioned so that a first photodiode in the plurality of photodiodes absorbs blue light from a blue color filter, a second photodiode in the plurality of photodiodes absorbs green light from a green color filter, a third photodiode in the plurality of photodiodes absorbs red light from a red color filter, and a fourth photodiode in the plurality of photodiodes absorbs infrared light from an infrared color filter.

15. The image sensor of claim 1, wherein the plurality of isolation regions include at least one of hafnium oxide, tantalum oxide, zirconium oxide, titanium oxide, or lanthanum oxide.

* * * * *

UNITED STATES PATENT AND TRADEMARK OFFICE
CERTIFICATE OF CORRECTION

Page 1 of 1

PATENT NO. : 9,911,770 B2
APPLICATION NO. : 15/169477
DATED : March 6, 2018
INVENTOR(S) : Yang et al.

It is certified that error appears in the above-identified patent and that said Letters Patent is hereby corrected as shown below:

In the Claims

| Column | Line | Error |
|---|---|---|
| 7 (Claim 1) | 5 | "an array an" should read --an array and-- |

Signed and Sealed this
Twenty-fourth Day of July, 2018

Andrei Iancu
*Director of the United States Patent and Trademark Office*